Dec. 17, 1963 J. E. THOMAS, JR 3,114,865

SEMICONDUCTOR AND UNITARY CONNECTOR STRUCTURE COMPRISING ALTERNATELY STACKED BASE AND EMITTER LEADS

Original Filed Aug. 8, 1956 2 Sheets-Sheet 1

Dec. 17, 1963 J. E. THOMAS, JR 3,114,865

SEMICONDUCTOR AND UNITARY CONNECTOR STRUCTURE COMPRISING ALTERNATELY STACKED BASE AND EMITTER LEADS

Original Filed Aug. 8, 1956 2 Sheets-Sheet 2

United States Patent Office 3,114,865

Patented Dec. 17, 1963

3,114,865

SEMICONDUCTOR AND UNITARY CONNECTOR STRUCTURE COMPRISING ALTERNATELY STACKED BASE AND EMITTER LEADS

Jacob Earl Thomas, Jr., Weston, Mass., assignor to The Bendix Corporation, a corporation of Delaware Original application Aug. 8, 1956, Ser. No. 602,697, now Patent No. 3,063,129, dated Nov. 13, 1962. Divided and this application Mar. 7, 1960, Ser. No. 13,181
2 Claims. (Cl. 317—234)

This invention relates to transistors and more particularly to a novel form of construction for junction transistors.

Because of the extremely small physical size of the various zones of a junction transistor, it is difficult to affix firmly the external circuit leads which must be connected to each of these zones. For example, in a double diffused junction transistor, leads must be connected to one layer which may be 0.005" thick and two superimposed layers which may be 0.0001" thick. The prior art has evolved at least two techniques for making these connections. In the first method a bevel cut is made through the various layers to enlarge their exposed surfaces and then microscopic techniques are used to alloy connector wires to each of the zones. The lead wires are plated with a metal that contains a donor or acceptor depending on whether they are to be connected to an N or P region, respectively. During the alloying process these coatings dope their adjacent, opposite type regions forming a rectifying connection with those regions so that absolutely accurate positions need not be maintained and shorts are eliminated. In the second method of connection, thin strips of acceptor and donor metals are plated on to the exposed transistor zone and they are then heated so as to cause them to alloy down into their respective P and N regions, making ohmic contacts. They also alloy so as to form "regrowth" layers where they pass through or make contact with their opposing material. These regrowths form a rectifying contact with their adjacent regions. Lead connections are then made to the plated strips.

In both of these methods the lead wires, because of their delicate dimensions, must be connected to terminals which in turn connect to the external circuit. The resulting connections are relatively weak mechanically because of the small lead dimensions. A more serious disadvantage is their high electrical resistance and resultant low current capacity. Since any heating affects the transistor operation adversely, the power output must be restricted to a value that the leads can handle easily.

It also is desirable to have as great a length of emitter-base interface as possible in a junction transistor in order to aid the injection process and to decrease the emitter-to-base resistance. It is recognized that an interleaved emitter-base lead structure will achieve this aim but the prior art connection methods are not easily adaptable to such a structure. Attempts to plate alloys in an interleaf design may fail because surface tension in the molten phase causes the pattern to distort under the heat which is necessary for alloying.

Another objection to the present methods of bringing leads to junction transistors arises from the fact that manual operations are necessary to space the leads relative to one another. It would be preferable to provide an assembly of leads that could be joined automatically to the transistor proper.

The present invention overcomes these and other disadvantages of the present connection techniques. It comprises a plurality of metal plates which are coated with a donor metal and another plurality of similar plates which are coated with an acceptor. The plates are stacked alternately with an insulating sheet between each plate. One type of plate has an extension in a first direction and the other type has an extension in a second direction. The extensions are fused or otherwise joined in groups and act as external connecting terminals. An end of the stack is fused against a double diffused or grown body to form the connections to the various layers. In an alternative embodiment the stack is used with a single-layer body and one type of plate serves to form a third alloyed junction.

It is an object of this invention to provide a transistor structure in which the connection leads are affixed to the transistor body in a mechanically and electrically strong manner.

Another object is to provide a connection to transistors which can carry relatively high currents.

A further object is to provide a connection scheme for transistors that provides a long emitter lead to base lead interface.

A further object is to provide a transistor lead that may be used as the external connecting terminal, no secondary metal to metal junction being necessary.

A still further object is to provide a transistor construction such that the emitter and base leads may be positioned relative to one another before being assembled to the body so that the assembly operation may be performed automatically.

Other objects, advantages and applications of the present invention will be made apparent by the following detailed description of two embodiments of the invention. The description makes reference to the accompanying drawings in which.

Figure 1:
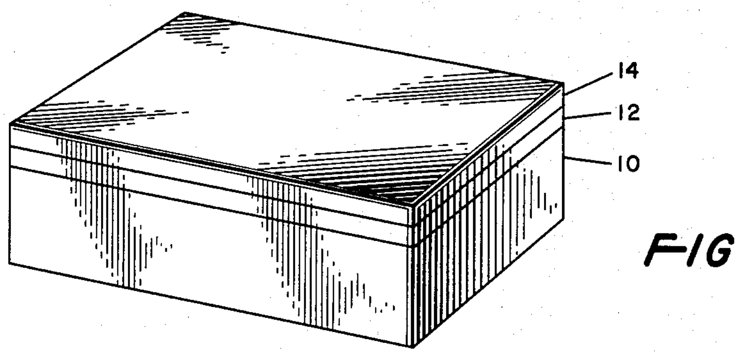
FIGURE 1 is a perspective view of a junction transistor body.

The body of the transistor may be a silicon wafer 10 which is approximately 0.005" thick. This N type wafer serves as the collector in an N-P-N type arrangement. A P type base 12 and an N type emitter 14 may be formed on this body 10 by the double diffusion process that is known to the prior art. In this process an acceptor element and a donor element are coated over the silicon wafer and the wafer is then heated to cause these P and N layers to diffuse into the body. Because of the different diffusion rates of the acceptors and donors and because of the differences in the concentrations originally plated, an extremely thin acceptor base is formed over the body and a donor emitter layer is formed over this base layer. Both of these layers may be in the order of 0.0001" in thickness.

Because of the relatively large size of the silicon collector wafer 10, no difficulty is encountered in making contact to it. Such contact may be achieved by alloying or soldering the wafer to a base of a metallic material such as Kovar, a metallic alloy manufactured by the Westinghouse Electric Corp. The metallic base should be large in relation to the transistor so as to efficiently dissipate heat.

Figure 2:
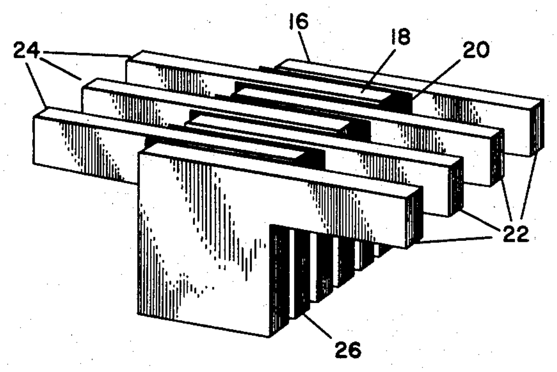
FIGURE 2 is a perspective view of the connector plates of the present invention.
Figure 3:
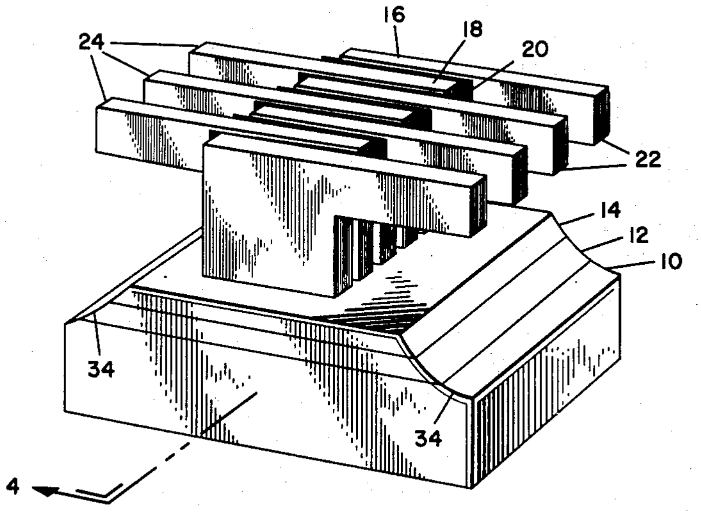
FIGURE 3 is a perspective view of the assembly of the body of FIGURE 1 with the connectors of FIGURE 2.

Contact to the emitter 14 and base layer 12 is more difficult to achieve because of their very thin dimensions. In the present invention such contact is achieved through use of stacks of connectors as shown in FIGURE 2. The stack constitutes a series of molybdenum plates 16 coated with an acceptor such as aluminum, alternated with a series of molybdenum plates 18 which are coated with a donor material such as antimony gold alloy. Up to ten or more of each type of plate may be used, although only a few of each type plate is shown for simplicity. Alternate plates are separated from one another by mica sheets 20. The plates all take an L shape, their long sides extending outwardly from the stack as as at 22 and 24. All of the acceptor coated plates 16 extend in one direction from the pile 22 while the donor coated plates 18 extend from the other direction 24. These extensions are later fused together and serve as the transistor's connector to the external circuitry.

Molybdenum was chosen for a base material for the plate because its coefficient of temperature expansion is very similar to that of the silicon wafer to which it is attached so that expansion in one of the members due to the variation in processing temperature or ambient temperature does not cause separation between the wafer and its connecting plates. The plates are assembled in an uncoated condition in the stack with the insulating sheets 20. Then the stack is placed in an acceptor type plating bath and the cathode is connected to the plates 16 through the connector 22. After this process is completed the stack is placed in a donor type plating bath and the cathode is connected to the plates 18 through the connector 24.

The plating thicknesses are so controlled as to deposit approximately 0.0001″ more plate on the acceptor coated plates 16 than on the donor coated plates 18. This is done so that the plates when fused into the double diffused wafer will make contact with their proper layers.

Figure 4:
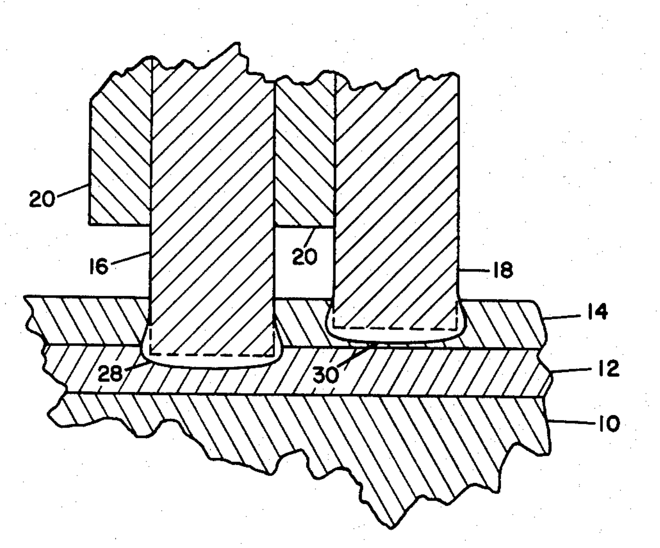
FIGURE 4 is a section through the assembly taken along line 4—4 of FIGURE 3.

The next step in the process is to press the stack surface 26 of the plates against the top layer of the previously prepared double diffused N-P-N sandwich. The assembly is then heated to approximately 700° C. and the ends of the plates are alloyed into the emitter and base layers of the sandwich under approximately 20 p.s.i. pressure. As is shown in FIGURE 4, the plating on the donor 18 and acceptor 16 connector plates alloys into the emitter 12 and base 14 layers in such a manner as to form extensions of the plates which are termed regrowth layers. The acceptor regrowth layers 28 pass directly through the top donor layer and, therefore, form rectifying contact with respect to the donor layer 14 and form an ohmic contact to the acceptor base 12. In a like manner, the donor coated plates 18 form regrowth layers 30 about them that obviate the possibility of their forming an ohmic contact with the base layer 12 while they do form an ohmic contact with the emitter layer 14.

The extending plate ends 22 and 24 are fused together to form connections to external circuitry. The edges of the transistor not in contact with the connecting plate may be cut away as at 34 in order to reduce the collector to base capacitance. A transistor having this form of connection therefore achieves a relatively large area of connector contact. The area of emitter contact being at a controlled dimension with respect to the areas of base contact and the entire contact being made in a strong physical manner.

Figure 5:
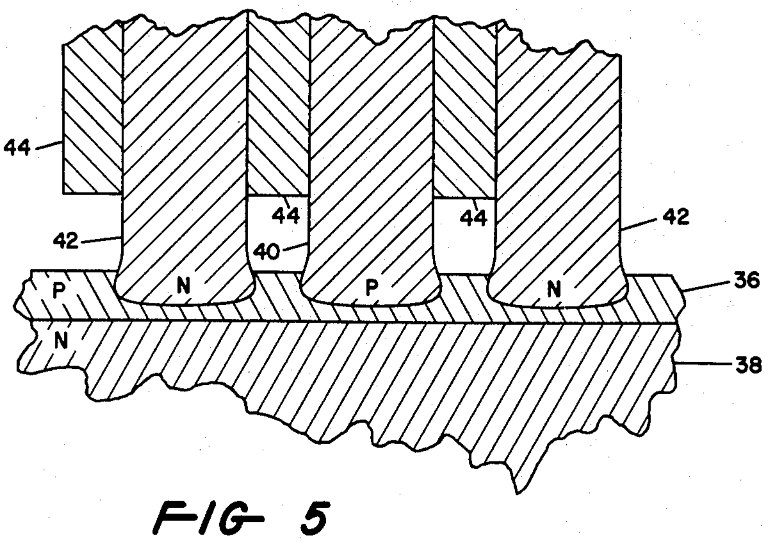
FIGURE 5 is a section through an alternative embodiment of the invention.

An alternative embodiment of the present invention is shown in FIGURE 5. Here the diffusion process or a similar method is used to form a single thin P type base layer over an N type silicon body 38. A stack of connector plates comprising acceptor coated molybdenum plates 40 alternated with donor coated molybdenum plates 42 and separated by mica sheets 44 is alloyed into contact with the crystal in the same manner as the stack in the embodiment of FIGURE 2. The acceptor coated plates 40 form an ohmic contact with the P type layer 36 and thus serve as connectors to it. The donor coated plates 42 alloy with the P layer 36 so as to form P-N junctions. In this manner the connector itself provides one of the junctions.

This is a division of my co-pending application Serial No. 602,697, entitled "Transistor," filed August 8, 1956, now Patent No. 3,063,129.

While the two preferred embodiments have been described as incorporating certain materials and structures and as being formed by certain processes, the scope of the invention is intended to be limited only by the following claims.

I claim:

1. A semiconductor device having a body of at least one N type volume and at least one P type volume with one of said volumes overlaying the other of said volumes thereby forming an outer and inner volume comprising,
   a plurality of donor material plates in contact with at least one of said volumes of said body,
   a plurality of acceptor plates in contact with at least one of said volumes of said body,
   connecting means for connecting said donor material plates to an external circuit being formed to said donor material plates and extending in a first common direction,
   connecting means for connecting said acceptor material plates to an external circuit being formed on said acceptor material plates and extending in a second common direction,
   said donor and eceptor plates disposed in parallel alternating relationship to one another,
   insulating plates being placed between said donor and acceptor plates for spacing and maintaining separation between said donor plates and said acceptor plates, thereby forming a unitary stack of donor and acceptor plates forming a contact of exceptional mechanical strength and increased electrical conductivity.

2. The semiconductor apparatus of claim 1 with said donor plates differing in length from said acceptor plates in the dimension normal to said outer volume by an amount corresponding to the thickness of the outer layer of said semiconductor body so that when the shorter of said donor and acceptor plates is making contact with said outer volume of said N and P type volumes, the longer of said donor and acceptor plates has penetrated said outer volume and is make contact with said inner volume.

References Cited in the file of this patent

UNITED STATES PATENTS

| | | |
|---|---|---|
| 1,865,351 | Hollnagel et al. | July 5, 1932 |
| 2,704,340 | Baird | Mar. 15, 1955 |
| 2,861,018 | Fuller et al. | Nov. 18, 1958 |
| 2,874,341 | Biondi et al. | Feb. 17, 1959 |
| 2,919,386 | Ross | Dec. 29, 1959 |